United States Patent

[11] 3,617,821

[72] Inventor Willem Gerard Einthoven
Belle Meade, N.J.
[21] Appl. No. 73,028
[22] Filed Sept. 17, 1970
[45] Patented Nov. 2, 1971
[73] Assignee RCA Corporation

[54] HIGH-VOLTAGE TRANSISTOR STRUCTURE HAVING UNIFORM THERMAL CHARACTERISTICS
4 Claims, 1 Drawing Fig.

[52] U.S. Cl. ........ 317/235, 317/234
[51] Int. Cl. ........ H01l 1/12
[50] Field of Search ........ 317/235, 234

[56] References Cited

UNITED STATES PATENTS

| | | | |
|---|---|---|---|
| 2,942,166 | 6/1960 | Michlin | 317/234 |
| 3,012,305 | 12/1961 | Ginsbach | 317/234 X |
| 3,040,197 | 6/1962 | Gudmundsen | 317/234 X |
| 3,225,416 | 12/1965 | Diebald | 317/235 X |
| 3,532,944 | 10/1970 | Ollendorf et al. | 317/234 |

*Primary Examiner*—James D. Kallam
*Attorney*—Glenn H. Bruestle

ABSTRACT: A high-voltage transistor is formed in a semiconductor body having two opposed major surfaces. The transistor has emitter, base, and collector regions, with the emitter-base junction extending to a first one of the surfaces, and with the collector region extending to the second surface. A nickel layer is disposed on the second surface, and a layer of a thermally conductive metal of about the same thickness as the semiconductor body, or greater, is integrally joined to the nickel layer.

PATENTED NOV 2 1971 3,617,821
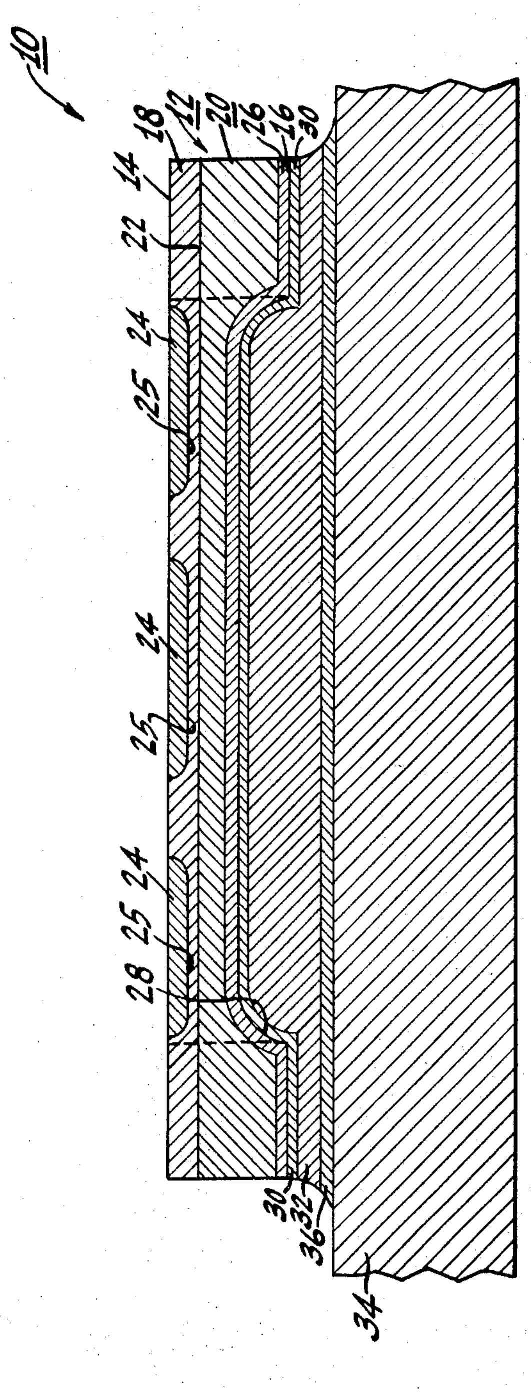
INVENTOR.
WILLEM G. EINTHOVEN
BY Herbert L. Allen
Attorney

HIGH-VOLTAGE TRANSISTOR STRUCTURE HAVING UNIFORM THERMAL CHARACTERISTICS

BACKGROUND OF THE INVENTION

The present invention relates to semiconductor devices, and more particularly, relates to high-voltage transistors.

It is known in the design of high-voltage transistors to employ a collector region having a high conductive portion and a highly resistive region between the base-collector junction and the highly conductive portion. It is also known that the ability of such devices to sustain high surface breakdown voltages is increased by employing a well in the collector region, so that the highly resistive portion is thicker at the edge of the device where surface breakdown normally occurs.

A major problem with high-voltage devices is the manner in which the active pellet is joined to the metal substrate. Since solder has relatively poor thermal conductivity, then such devices are often limited by the inability of the solder joint to uniformly remove heat from the pellet. This nonuniform heat dissipation often causes local hot spots along the emitter-base junction, resulting in the well-known thermal runaway, or second breakdown, phenomenon. It is therefore desirable to employ means for providing uniform thermal dissipation which are compatible with the high-voltage requirements of the device.

SUMMARY OF THE INVENTION

The present invention comprises an improved high-voltage transistor structure. The structure includes a transistor of the type formed in a semiconductor body having two opposed major surfaces. The transistor has emitter and base regions with a PN junction between those regions; and a collector region adjacent the base region, with a PN junction therebetween. The base region extends to a first one of the surfaces, and the collector region includes a highly conductive portion which extends to the second surface. A thin layer of nickel is disposed on the second surface, and a mass of thermally conductive metal is integrally joined to the nickel layer. The thermally conductive metal mass is as thick as, or thicker than, the semiconductor body.

THE DRAWING

The single FIGURE of the drawing is a cross section of an improved high-voltage transistor structure according to the present invention.

DETAILED DESCRIPTION

A preferred embodiment of the structure will be described with reference to the drawing. The improved transistor structure, referred to generally as 10, includes a power transistor formed in a semiconductor body 12 having upper and lower opposed major surfaces 14 and 16, respectively. The size, shape, and composition of the semiconductor body 12 is not critical; by way of example, the body 12 may comprise a silicon pellet which is 200.0 mils square and 6.0 mils thick, as measured through the center of the body.

The transistor further includes a base region 18 and a collector region 20 formed in the semiconductor body 12, with a base-collector PN-junction 22 between the regions. The base region 18 extends to the upper surface 14, and the collector region 20 extends to the lower surface 16. Disposed within the base region 18, from the upper surface 14, is a plurality of emitter regions 24 of the same conductivity type as the collector region 20. Each emitter region 24 and the base region 18 forms an emitter-base junction 25, each of which terminates at the first surface 14 within an area which is described below. The device 10 may be an NPN or PNP device; however, an NPN device is described herein. The collector region 20 includes a highly conductive portion 26 which is adjacent, and parallel to, the lower surface 16. The remainder of the collector region 20 is preferably highly resistive.

For increased surface breakdown capability, the lower surface 16 of the semiconductor body 12 preferably has a well 28 therein which extends into the collector region 20 and terminates short of the base-collector junction 22. Suitably, the well 28 is centrally disposed in the lower surface 16, and the distance between the edge of the lower surface and the periphery of the well is equal to, or greater than, the depth of the well. For example, the well 28 may be between 3.0 and 4.0 mils deep, and the periphery of the well may be 7.0 mils from the edge of the lower surface 16.

A thin nickel layer 39 preferably at least 50 A. thick, is disposed on the lower surface 16, including that portion of the surface which defines the well 28. A thermally conductive metal mass 32 is integrally joined to the nickel layer 30 and fills the well 28. Preferably, the thermally conductive metal mass 32 is selected from the group consisting of gold, silver, and copper. The metal mass 32 is as thick or thicker than, the semiconductor body 12; for example, it may be 6.0 to 8.0 mils thick, as measured through the center of the well 28, when the semiconductor body 12 is 6.0 mils thick. The transistor structure 10 may be soldered to an enclosure header 34 by means of a solder joint 36.

Each emitter-base PN-junction 25 terminates at the upper surface 14 within the confines of an areas of that surface which corresponds to, and opposes, the area of the well 28 in the lower surface 16. This insures even heat dissipation along each of the emitter-base junctions 25.

The base, collector, and emitter regions 18, 20, and 24 may be formed in the semiconductor body 12 by standard diffusion or epitaxial techniques that are well known in the semiconductor art. The well 28 is formed in the lower surface 16 by treating that surface with a standard photoresist-etch sequence, in order to expose that portion of the surface where the well is to be located. The exposed portion of the lower surface is then treated with a suitable etchant, such as nitric-acetic-hydrofluoric acid, in order to remove the unwanted portions of the collector region and to extend the well to the desired depth. The remaining photoresist is then stripped away from the lower surface 16, and that surface and the collector region 20 are treated with a suitable conductivity modifier, in order to form the highly conductive portion 26 of the collector region. The nickel layer 30 is then electrolessly deposited on the second surface 16. The mass of metal 32 is thereafter deposited on the nickel layer 30 and in the well 28 by electrolytic plating. For example, a mass of silver may be deposited by electrolytic deposition from a silver cyanide bath, while maintaining the electrolytic current at about 25 amperes/inch$^2$.

The above-described power transistor structure has a very low thermal resistance between distant emitter sites and an excellent uniform thermal dissipation characteristic, because the thermally conductive metal mass extends into the body close to the base-collector junction to provide the desired uniformity. This low lateral thermal resistance and the increase in the uniformity of thermal dissipation results, in turn, in better forward and reverse second breakdown characteristics, and in an improved high-current beta figure of merit.

I claim:

1. An improved high-voltage transistor structure, including a transistor of the type formed in a semiconductor body having two opposed major surfaces, said transistor having emitter and base regions with a PN junction between those regions, and a collector region adjacent said base region with a PN junction therebetween, said base region extending to a first one of said surfaces and said collector region having a highly conductive portion extending to the second surface, wherein the improvement comprises:

a layer of nickel of at least on the order of 5.0 A. thick disposed on said second surface;

a mass of thermally conductive metal integrally joined to saID nickel layer and wherein said metal mass is at least as thick as said semiconductor body.

2. An improved transistor according to claim 1, wherein said thermally conductive metal is selected from a group consisting of gold, silver, and copper.

3. An improved transistor according to claim 2, further comprising:

said second surface having a well centrally disposed therein extending into said collector region and terminating short of said base-collector junction; and wherein the distance between the edge of said second surface and the periphery of said well is greater than the depth of said well.

4. An improved transistor according to claim 3, said emitter region comprising:

a plurality of discrete emitter portions;

a separate emitter-base PN junction between each portion and said base region: and each separate emitter-base PN junction terminating at said first surface within the confines of an area on said first surface corresponding to said well in said second surface.

* * * * *